United States Patent
Fan

(10) Patent No.: US 8,556,357 B2
(45) Date of Patent: Oct. 15, 2013

(54) COMPUTER RACK

(75) Inventor: Chen-Lu Fan, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 153 days.

(21) Appl. No.: 12/981,713

(22) Filed: Dec. 30, 2010

(65) Prior Publication Data

US 2012/0018389 A1 Jan. 26, 2012

(30) Foreign Application Priority Data

Jul. 26, 2010 (CN) .......................... 2010 1 0236815

(51) Int. Cl.
*A47G 29/00* (2006.01)

(52) U.S. Cl.
USPC ...................................................... 312/265.4

(58) Field of Classification Search
USPC .......... 312/257.1, 265.1, 265.4, 223.2, 334.4, 312/140, 265.2, 265.3, 223.1; 211/26, 175, 211/189; 174/100; 248/68.1, 49; 361/724, 361/725, 726, 727, 829
See application file for complete search history.

(56) References Cited

U.S. PATENT DOCUMENTS

| | | | | |
|---|---|---|---|---|
| 4,014,435 A * | 3/1977 | Rowley et al. | ................. | 206/386 |
| 4,715,502 A * | 12/1987 | Salmon | ............................ | 211/26 |
| 4,720,016 A * | 1/1988 | Kay | ................................ | 211/96 |
| 6,974,037 B2 * | 12/2005 | Haney | ............................... | 211/26 |
| 7,293,666 B2 * | 11/2007 | Mattlin et al. | ................. | 211/189 |
| 7,316,379 B1 * | 1/2008 | Graham | ....................... | 248/298.1 |
| 7,495,169 B2 * | 2/2009 | Adducci et al. | ................... | 174/50 |
| 8,146,755 B2 * | 4/2012 | Schwartzkopf et al. | ....... | 211/103 |
| 8,203,854 B2 * | 6/2012 | Tsai et al. | ...................... | 361/829 |
| 2002/0046979 A1 * | 4/2002 | Larsen et al. | .................... | 211/26 |
| 2003/0034717 A1 * | 2/2003 | Yao | ............................... | 312/223.1 |
| 2004/0189162 A1 * | 9/2004 | Davis et al. | ................. | 312/265.3 |
| 2005/0259383 A1 * | 11/2005 | Ewing et al. | .................. | 361/622 |
| 2007/0251904 A1 * | 11/2007 | Winig et al. | ............. | 211/106.01 |
| 2008/0198536 A1 * | 8/2008 | Ewing et al. | ................. | 361/622 |
| 2010/0110621 A1 * | 5/2010 | Dunn et al. | .............. | 361/679.01 |

* cited by examiner

*Primary Examiner* — Darnell Jayne
*Assistant Examiner* — Hiwot Tefera
(74) *Attorney, Agent, or Firm* — Altis & Wispro Law Group, Inc.

(57) ABSTRACT

A computer rack includes an upper frame, a lower frame, four parallel support legs, two horizontal struts, two mounting members, and two vertical struts. The support legs connect between the upper frame and the lower frame. The four support legs are parallel each other. Each horizontal strut is attached to two of the four support legs. The two horizontal struts is substantially perpendicular to the four support legs. Each horizontal strut is attached to two of the four support legs and is substantially perpendicular to the four support legs. Wherein, the mounting members are configured to be mounted in different positions to establish different distances between the two vertical struts in a direction substantially perpendicular to the vertical strut.

12 Claims, 4 Drawing Sheets

COMPUTER RACK

BACKGROUND

1. Technical Field

The present disclosure relates to computer racks, more particularly to a computer rack capable of accommodating computer modules of different sizes.

2. Description of Related Art

It is important to provide high reliability and high capacity of operation for computing systems. Computer systems, such as blade server systems are typically rack mountable, with each processor occupying a frame in the rack. The trend in recent times is to accommodate more computer modules in a computer rack. The typical computer rack includes a frame, plural pairs of horizontal struts attached to the frame, and plural pairs of vertical struts perpendicularly attached to the horizontal struts. Each computer module (e.g., a blade of a server system) can be attached between the vertical struts. However, the distance between each pair of vertical struts is invariable, and the typical computer rack cannot accommodate computer modules of different sizes.

Therefore, there is room for improvement within this art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
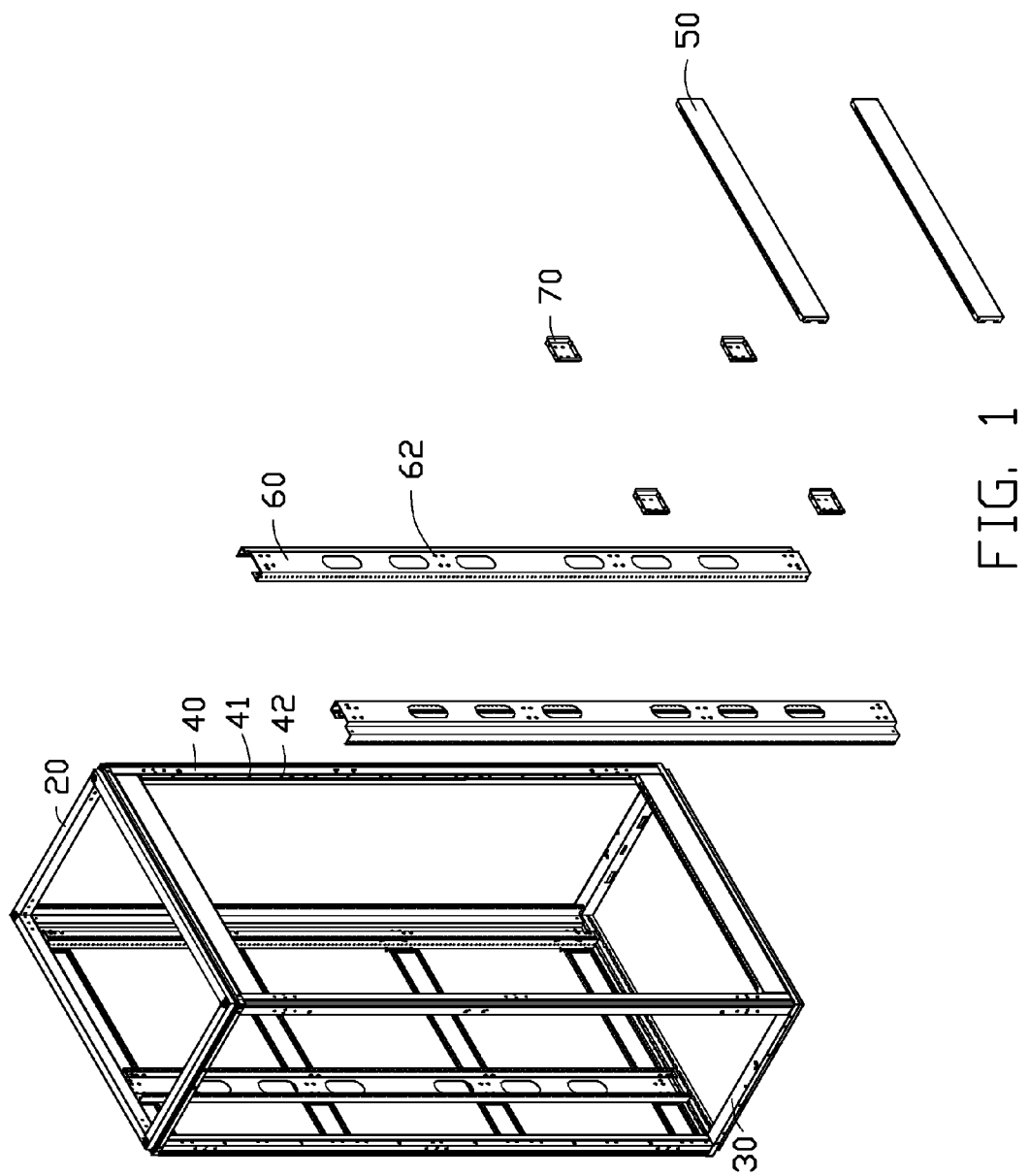
FIG. 1 is an isometric and partially exploded view of a computer rack in accordance with an embodiment.
Figure 2:
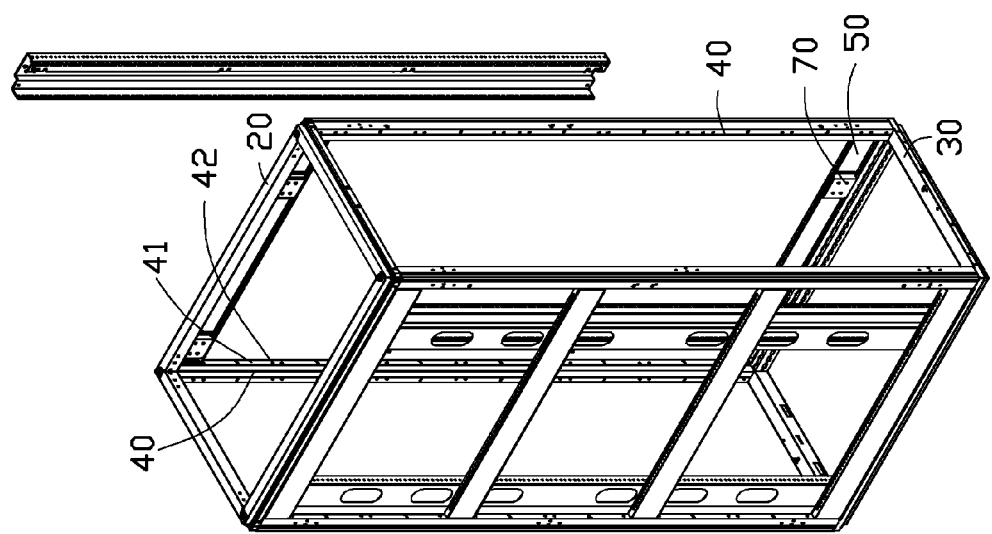
FIG. 2 is similar to FIG. 1, but viewed from another aspect.

Referring to FIGS. 1 and 2, an embodiment of a computer rack includes an upper frame 20, a lower frame 30, four support legs 40 connected between the upper frame 20 and the lower frame 30, multiple pairs of horizontal struts 50, two pairs of vertical struts 60, and multiple pairs of mounting members 70. Each of the upper frame 20 and the lower frame 30 comprises four horizontal beams which forms a rectangular shape. The support legs 40 are connected to the four corners of the upper frame 20 and the lower frame 30. Each support leg 40 defines a side surface 41. A plurality of screw holes 42 is defined in each side surface 41 at different vertical locations.

Figure 3:
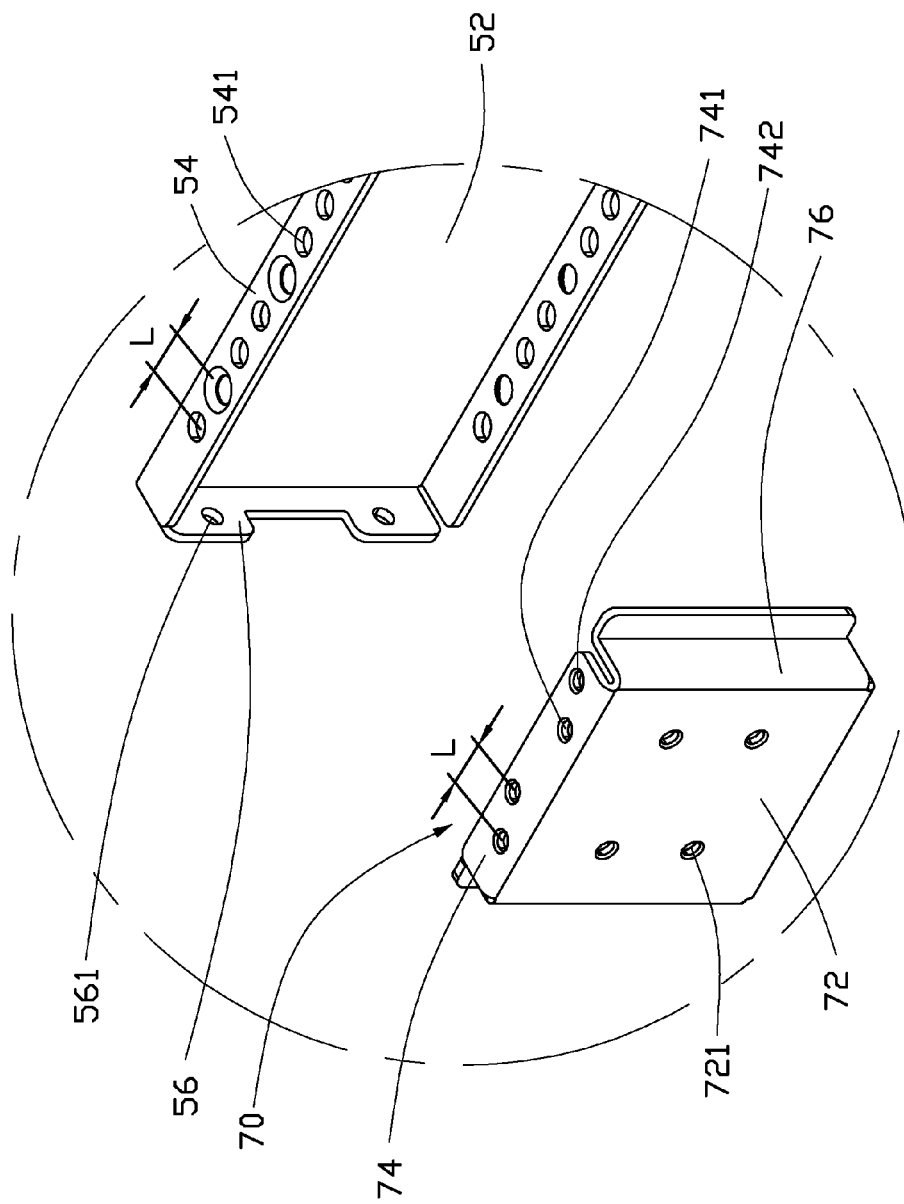
FIG. 3 is an enlarged view of the circled portion III of FIG. 2.

Referring to FIG. 3, each of the horizontal struts 50 includes a lengthwise main body 52, a pair of securing flanges 54, and a pair of fixing pieces 56. The pair of securing flanges 54 extends perpendicularly from upper and lower edges of the lengthwise main body 52. The pair of fixing pieces 56 extends perpendicularly from two distal ends of the lengthwise main body 52. A plurality of securing holes 541 is uniformly defined in each of the securing flanges 54 at different horizontal locations. A pair of through holes 561 is defined in each of the fixing pieces 56 corresponding to the screw holes 42. A length of each of the horizontal struts 50 is substantially equal to a distance between two support legs 40. Thus, each of the horizontal struts 50 can be secured between two support legs 40 at the left or right side.

Each of the mounting members 70 includes a square plate 72, substantially parallel to the lengthwise main body 52; a pair of fixing flanges 74, extending perpendicularly from upper and lower edges of the square plate 72; and a pair of L-shaped flanges 76, extending from opposite side edges of the square plate 72. A pair of first fixing holes 741 and a pair of second fixing holes 742 are defined in each of the fixing flanges 74. The array direction of the first fixing holes 741 is substantially parallel to the array direction of the second fixing holes 742. The distance between two adjacent securing holes 541 is equal to L. The distance between the adjacent first fixing hole 741 and the second fixing hole 742 is equal to L, in a direction parallel to the square plate 72. The first fixing holes 741 or the second fixing holes 742 can align with two of the securing holes 541 at different horizontal locations. Four mounting holes 721 are defined in the square plate 72 for mounting the vertical strut 60. A width of the square plate 72 of each of the mounting members 70 is substantially equal to the width of the lengthwise main body 52 of each of the horizontal struts 50.

Figure 4:
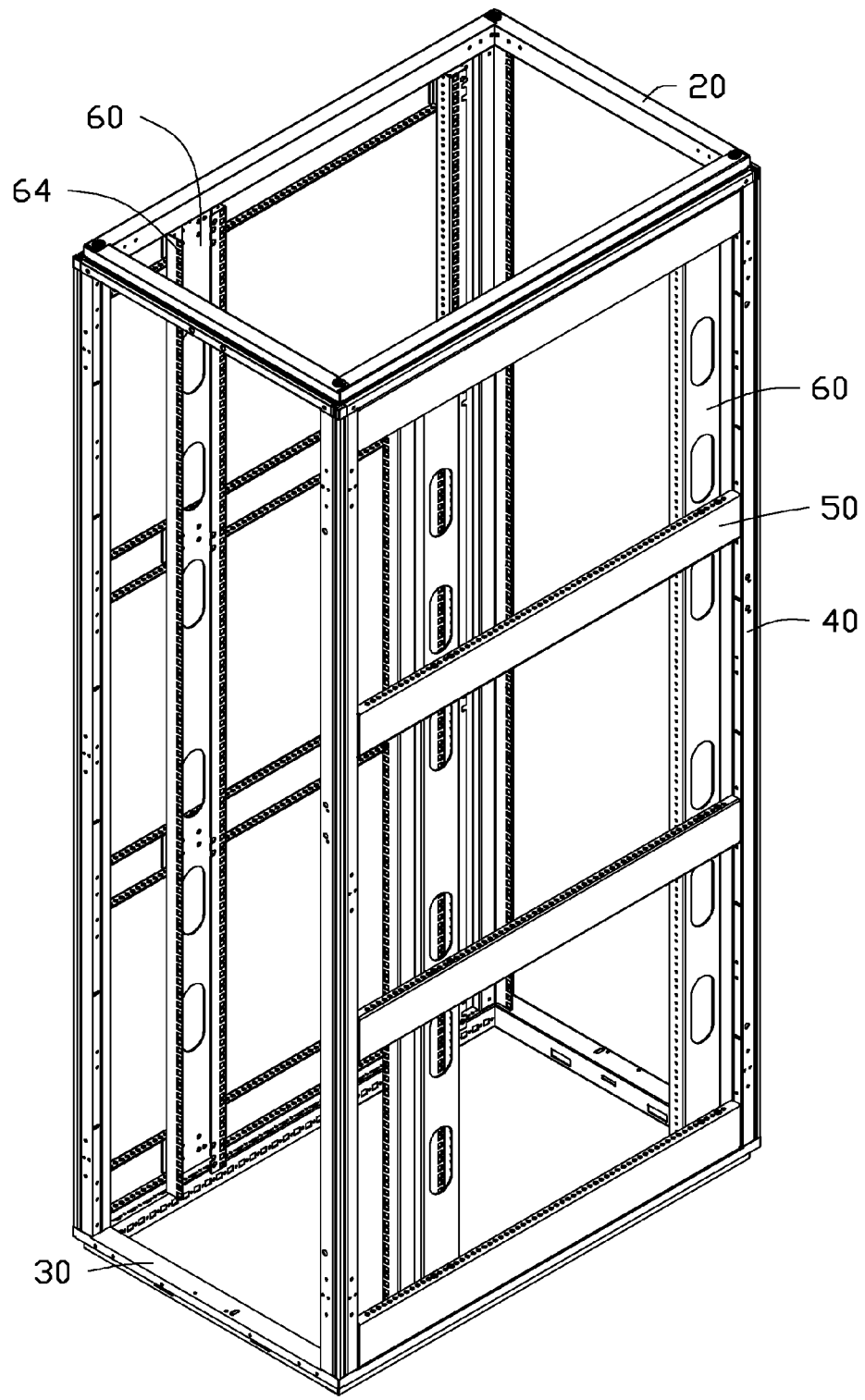
FIG. 4 is an assembled view of the computer rack of FIG. 1.

Referring to FIG. 4, in assembly, the fixing pieces 56 of each of the horizontal struts 50 abuts two support legs 40 at the left or right side of the computer module housing. The through holes 561 of each of the fixing pieces 56 are aligned with two screw holes 42 of one of the support legs 40 at a desired height. Screws (not shown) are inserted into the through holes 561 and the selected screw holes 42 to securely attach each of the horizontal struts 50 between one pair of the support legs 40 at the desired height. One pair of mounting members 70 is mounted at an inner side of the lengthwise main body 52 of each of the horizontal struts 50. The first fixing holes 741 of each of the mounting members 70 align with selected securing holes 541 of each of the horizontal struts 50. Screws (not shown) are inserted into the securing holes 541 and the first fixing holes 741 for securing the mounting members 70 to the horizontal struts 50 at the desired horizontal location. The L-shaped flanges 76 of the mounting members 70 can be secured to the surfaces of the horizontal struts 50 by welding to further secure the mounting members 70. Each of the vertical struts 60 is attached to two (an upper one and a lower one) mounting members 70. Screws (not shown) are inserted into holes 62 defined in each of the vertical struts 60 and the mounting holes 721 of the corresponding mounting members 70 to secure the vertical strut 60 to the corresponding mounting members 70. The horizontal struts 50 are able to be attached to mounting members 70 with the second fixing holes 742 aligning with selected securing holes 541. The horizontal struts 50 are attached to mounting members 70 with different fixing holes aligning with selected securing holes 541 to change the distance between the two vertical struts 60.

In one embodiment, computer modules (e.g., blades of a server system) can be attached between the pair of vertical struts 60. A distance between the pair of mounting members 70 attached to each of the horizontal struts 50 can vary, and a distance between the pair of vertical struts 60 varies. Thus, the computer rack of the present disclosure can accommodate computer modules with different sizes and hold the computer modules at different heights.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A computer rack comprising:
   an upper frame;
   a lower frame;
   four support legs connecting the upper frame and the lower frame, and the four support legs are parallel to each other;
   two horizontal struts, the two horizontal struts are parallel each other, and each horizontal strut is attached to two of the four support legs and is substantially perpendicular to the four support legs; each horizontal strut comprises a lengthwise main body and two securing flanges extending from opposite sides of the lengthwise main body; a plurality of securing holes is defined in each securing flange;
   two mounting members; each mounting member comprises a square plate and two fixing flanges extending from opposite sides of the square plate; the square plate is located between the two securing flanges; two first fixing holes and two second fixing holes are defined in each fixing flange; the two first fixing holes are aligned in a first direction; and the two second fixing holes are aligned in a second direction, that is substantially parallel to the first direction; and
   two vertical struts, the two vertical struts parallel to each other, and each vertical strut attached to one of the two horizontal struts in a first position via one of the two mounting members when the two first fixing holes are aligned with two of the plurality of the securing holes; and each vertical strut attachable to the one of the two horizontal struts in a second position via the one of the two mounting members when the two second fixing holes aligned with the two of the plurality of the securing holes, thereby changing a distance between the two vertical struts in a direction substantially perpendicular to the vertical strut and the horizontal strut.

2. The computer rack of claim 1, wherein a mounting hole is defined in the square plate, and a hole is defined in the vertical strut corresponding to the mounting hole.

3. The computer rack of claim 1, wherein each of the two horizontal struts further comprises a fixing piece extending perpendicularly from a distal end of the lengthwise main body; a through hole is defined in the fixing piece; and each support leg defines a side surface, and a plurality of screw holes is defined in the side surface at different heights corresponding to the through hole.

4. The computer rack of claim 3, wherein the plurality of the securing holes is aligned in a third direction, and the plurality of screw holes is aligned in a forth direction substantially perpendicular to the third direction.

5. The computer rack of claim 1, wherein a width of the square plate is substantially equal to the width of the lengthwise main body.

6. The computer rack of claim 1, wherein the square plate is substantially parallel to the lengthwise main body.

7. A computer rack comprising:
   an upper frame;
   a lower frame;
   four support legs, connected between the upper frame and the lower frame, that are parallel to each other;
   a horizontal strut, that is substantially perpendicular to the four support legs, attached to two of the four support legs; the horizontal strut comprises a lengthwise main body and two securing flanges extending from opposite sides of the lengthwise main body; a plurality of securing holes is defined in each securing flange;
   a mounting member; the mounting member comprises a square plate and two fixing flanges extending from opposite sides of the square plate; the square plate is located between the two securing flanges; two first fixing holes and two second fixing holes are defined in each fixing flange; the two first fixing holes are aligned in a first direction; and the two second fixing holes are aligned in a second direction, that is substantially parallel to the first direction; and
   a vertical strut, the vertical strut, substantially parallel to the four support legs, attached to the horizontal strut in a first position via the mounting member when the two first fixing holes are aligned with two of the plurality of the securing holes; and the vertical strut attachable to the horizontal strut in a second position via the two mounting member when the two second fixing holes aligned with the two of the plurality of the securing holes, thereby changing a distance between the horizontal strut and the vertical strut in a direction substantially perpendicular to the horizontal strut and the vertical strut.

8. The computer rack of claim 7, wherein a mounting hole is defined in the square plate, and a hole is defined in the vertical strut corresponding to the mounting hole.

9. The computer rack of claim 7, wherein the horizontal strut further comprises a fixing piece extending perpendicularly from a distal end of the lengthwise main body; a through hole is defined in the fixing piece; each support leg defines a side surface, and a plurality of screw holes is defined in the side surface at different heights corresponding to the through hole.

10. The computer rack of claim 9, wherein the plurality of the securing holes is aligned in a third direction, and the plurality of screw holes is aligned in a forth direction substantially perpendicular to the third direction.

11. The computer rack of claim 7, wherein a width of the square plate is substantially equal to the width of the lengthwise main body.

12. The computer rack of claim 7, wherein the square plate is substantially parallel to the lengthwise main body.

* * * * *